United States Patent [19]
Glumac et al.

[11] Patent Number: 5,876,683
[45] Date of Patent: Mar. 2, 1999

[54] COMBUSTION FLAME SYNTHESIS OF NANOPHASE MATERIALS

[76] Inventors: Nicholas Glumac, 20 B Rutgers Rd., Piscataway, N.J. 08854; Bernard H. Kear, R.D. #3, Campbell's Brook Rd., Whitehouse Station, N.J. 08889; Ganesh Skandan, 60 D Cedar La., Highland Park, N.J. 08904; Yijia Chen, Apt. 109, 900 Davidson Rd., Piscataway, N.J. 00854

[21] Appl. No.: 552,191

[22] Filed: Nov. 2, 1995

[51] Int. Cl.⁶ .................................................. C23C 16/40
[52] U.S. Cl. ........................... 423/325; 423/246; 423/345; 423/440; 423/610; 423/625; 427/249; 427/255.1; 427/255.2; 427/223; 427/255.3
[58] Field of Search .................................. 427/248.1, 249, 427/255.1, 255.2, 223, 569, 577, 587, 588, 589, 255.3; 423/346, 345, 440, 325, 610, 625; 264/5, 6, 56, 80; 507/87

[56] References Cited

U.S. PATENT DOCUMENTS

| | | | |
|---|---|---|---|
| 1,583,333 | 5/1926 | Bigum | 165/91 |
| 2,118,438 | 5/1938 | Lawrence et al. | 71/69 |
| 3,642,521 | 2/1972 | Moltzam et al. | 117/105.2 |
| 4,014,980 | 3/1977 | Fujimaki et al. | 423/448 |
| 4,108,964 | 8/1978 | Kratel et al. | 423/336 |
| 4,221,825 | 9/1980 | Guerder et al. | 427/34 |
| 4,891,339 | 1/1990 | Calcote et al. | 501/87 |
| 4,900,483 | 2/1990 | Witzke et al. | 264/29.2 |
| 5,128,081 | 7/1992 | Siegel et al. | 264/81 |
| 5,186,872 | 2/1993 | Nishiwaki et al. | 264/5 |
| 5,268,337 | 12/1993 | Katz et al. | 501/94 |
| 5,514,350 | 5/1996 | Keer et al. | 422/198 |

FOREIGN PATENT DOCUMENTS

| | | |
|---|---|---|
| 421314 | 4/1991 | European Pat. Off. . |
| 131509 | 7/1984 | Japan . |

OTHER PUBLICATIONS

*Synthesis of Polymerized Preceramic Nanoparticle Powders by Laser Irradiation of Metalorganic Precursors,* P.R. Strutt, K. E. Gonsalves and T.D. Xiao, NanoStructured Materials, vol. 1, pp. 21–25, 1992 (no month).
*Ultrafine Oxide Powders Prepared by Inert Gas Evaporation,* B.Günther and A. Kumpmann, NanoStructured Materials, vol. 1, pp. 27–30, 1992 (no month).
*Processing and Properties of Nanostructured Wc–Co,* L. E. McCandish, B. H. Kear and B. K. Kim, NanoStructured Materials, vol. 1, pp. 119–124, 1992 (no month).
*Mechanosynthesis of Nanophase Materials,* P. Matteazzi, D. Basset and F. Miani, NanoStructured Materials, vol. 2, pp. 217–229, 1993, (no month).
*Synthesis of Nanosized Ceramic Nitride Powders by Microwave Supported Plasma Reactions,* NanoStructured Materials, vol. 2, pp. 451–456, 1993 (no month).
*Synthesis and Processing of Nanostructured M50 Type Steel,* K. E. Gonsalves, T. D. Xiao, G. M. Chow and C. C. Law, Nanostructured Materials, vol. 4, No. 2, pp. 139–147, 1994 (no month).
*Laser Synthesis of Nanometric Silica Powders,* M. Luce, N. Herlin, E. Musset and M. Chauchetier, NanoStructured Materials, vol. 4, No. 4, pp. 403–408, 1994 (no month).

*Primary Examiner*—Shrive Beck
*Assistant Examiner*—Timothy Meeks

[57] ABSTRACT

A low pressure combustion flame method for the production of nanophase powders, coatings and free-standing forms. The process involves controlled thermal decomposition of one or more metalorganic precursors in a flat-flame combustor unit in which both temperature distribution and gas phase residence time are uniform over the entire surface of the burner. It is this feature that makes the combustion flame reactor such a versatile tool for (1) high rate production of loosely agglomerated nanoparticle powders with controlled particle size and distribution, (2) uniform deposition of shape conformal nanophase coatings, and (3) net-shaped fabrication of nanocrystalline free-standing forms such as sheets, rings and drums. Applications for this new nanomaterials processing technology include electrical, thermal, optical, display, magnetic, catalytic, tribological and structural materials.

13 Claims, 4 Drawing Sheets

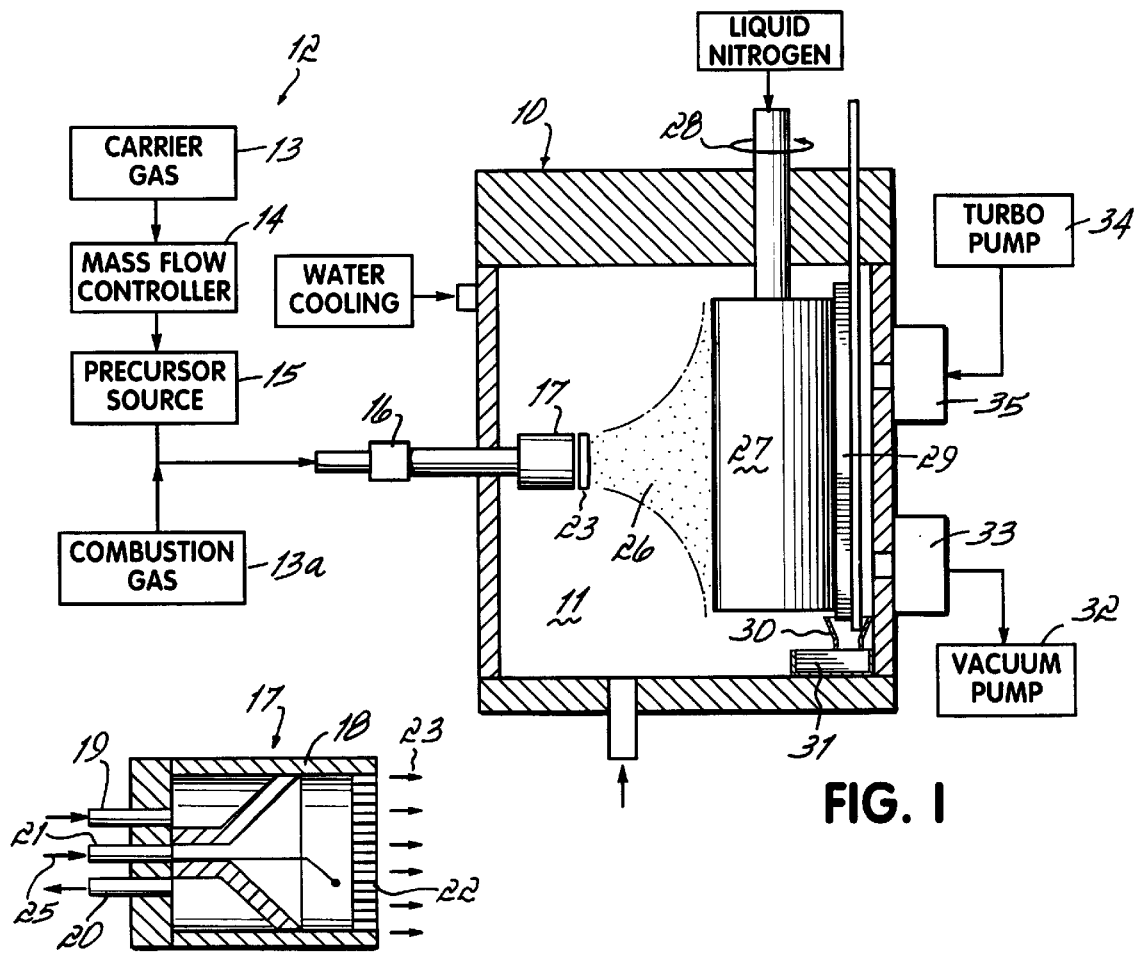
FIG. 1
FIG. 1A
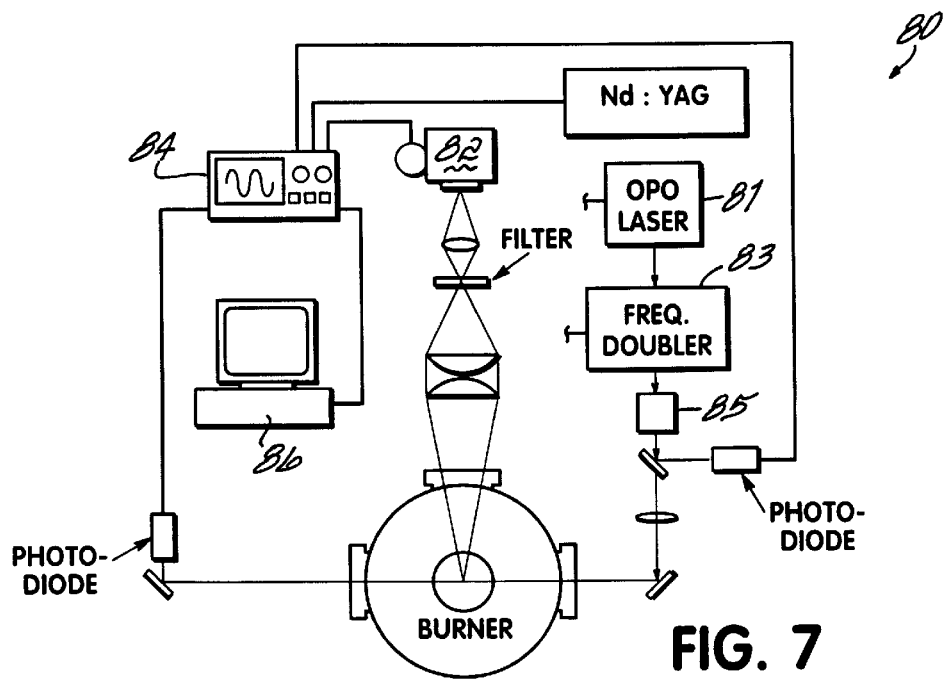
FIG. 7

COMBUSTION FLAME SYNTHESIS OF NANOPHASE MATERIALS

BACKGROUND OF THE INVENTION

Materials with fine-scale microstructures have long been recognized to exhibit remarkable and technologically attractive properties. In the past decade, interest has been growing in a new class of materials that are composed of ultrafine grains or particles. A feature of such "nanostructured" materials (n-materials) is the high fraction of atoms that reside at the grain boundaries or interfaces in the materials which exerts a profound influence on properties. Although much of today's research activity in the n-materials field is focused on the preparation of n-powders and their consolidation into bulk parts, there is growing interest in the fabrication of coatings and free-standing forms. Furthermore, there is an urgent need to develop scalable processes for the economical production of all types of nanostructured materials. The present invention addresses this need.

Nanophase powders have been produced in experimental quantities for almost a decade. The prior art methods of producing nanophase powders, however, are limited in the capability to produce commercial quantities of powders. The production of commercial quantities of mixed element technically important refractory compounds such as SiC, WC, HfC, $Si_3N_4$, $ZrO_2$ and $Al_2O_3$ and many other similar compounds has been especially difficult. Commercial quantities of these mixed element refractory nanophase powders have been produced by the thermal decomposition metalorganic precursors in either a combustion flame or plasma flame at ambient or near-ambient pressures. Production of nanophase powders by the combustion flame and plasma flame methods, however, have had the disadvantage of producing agglomerated powders. This agglomeration of nanophase particles is problematic in the fabrication of monolithic ceramic shapes for structural applications, where the bridging of agglomerated particles causes residual porosity in the sintered material, seriously limiting performance. The present invention overcomes the disadvantages of the prior art nanophase particle synthesis processes by providing a method for producing commercial quantities of mixed element nanophase ceramic powders without the presence of particle agglomerates through the controlled thermal decomposition of the metalorganic precursors in a low pressure environment.

SUMMARY OF THE INVENTION

The present invention is a new chemical synthesis process for the production of commercial quantities of nonagglomerated nanostructured ceramic powders starting from metalorganic precursors. In addition to producing nanostructured ceramic powders in a nonagglomerated state, the process has the added capability of being adapted to produce shape conforming nanophase coatings and nanocrystalline free-standing forms, including sheets, rings, and drums. The preferred heat source for the synthesis of nanophase oxide powders is a flat-flame combustor. The flat-flame combustor system of the present invention enables not only the economical production of nanophase single and multi-component powders, but also thin films and multilayers, diffusion and overlay coatings, and free-standing forms, such as sheets, rings and drums.

According to the present invention, the powders are formed by controlled thermal decomposition of a metalorganic precursor/carrier gas mixture in a flat-flame combustor unit. A low pressure is maintained in the reactor chamber by high-speed pumping. Gases such as hydrogen, methane, or acetylene burned in oxygen are used to generate a steady state combustion flame. The choice of combustible gas is critical since it can be a source of impurities in the product species. The flat combustion flame, extending a few millimeters out of the burner, provides a uniform heat source with a short residence time (a fraction of a second) for efficient thermal decomposition and reaction of the precursor/carrier gas stream. The substantial heat released in the flame allows the burner to support a high precursor flow rate at pressures as low as 1–50 mbar, which is in the optimal range for nanoparticle synthesis. The feasibility of high rate production of oxide ceramics by the Combustion Flame Reactor (CFR) method has been demonstrated, for example, n-$SiO_2$ powder has been synthesized from hexamethyldisilazane (HMDS) precursor in an oxidizing flame.

In the present invention, because of the use of a flat-flame combustor with uniform temperature and gas phase residence time over the entire surface of the burner, the as-synthesized n-powders display a narrow particle size distribution. The reduced pressure environment also enables the production of loosely agglomerated n-powders. Such powders can be consolidated by cold pressing/sintering at temperatures as low as 0.35 $T_m$.

The present invention has the further advantage of being operated in several different modes. In the nanoparticle production mode, a slowly rotating liquid nitrogen cooled metal drum collects a continuous stream of nanoparticles exiting from the combustion zone. In the nanophase coating deposition mode, a heated substrate is placed in front of the flat flame combustor to promote in situ sintering of the nanoparticles as they arrive at the substrate surface. In the nanocrystalline shape fabrication mode, the nanoparticles are deposited on a uniformly heated mandrel which acts as a passive substrate for the deposition. In this mode, the profile of the burner face is exactly matched to the profile of the passive substrate mandrel, allowing virtually any desired thick or thin structure to be fabricated, including a sheet, a ring, or a drum.

The objects and advantages of the present invention will be further appreciated in light of the following detailed description and drawings in which:

BRIEF DESCRIPTION OF THE DRAWINGS

FIG. 1 is a schematic view showing an apparatus used for the method of the present invention.

FIG. 1A is an enlarged, cross-sectional view of the flat flame combustor shown in FIG. 1.

FIG. 7 is a schematic of the laser and optical system used for process diagnostics of flame species, particle characteristics, and flame temperature.

DETAILED DESCRIPTION

Figures 2A, 2B:
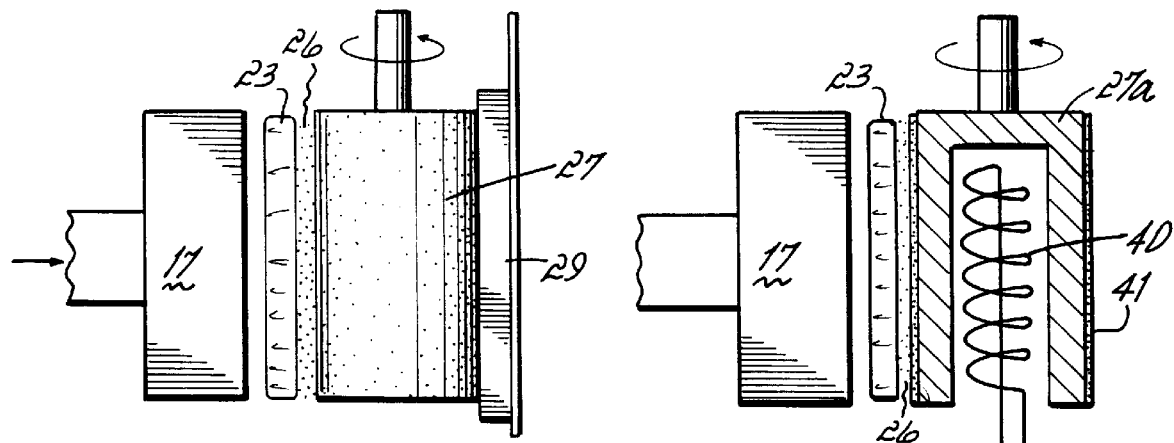
FIG. 2A is a schematic view of the method of the present invention in a nanopowder deposition mode.
FIG. 2B is a schematic view of the method of the present invention in a coating mode.

The reactor 10 of the present invention, shown more particularly in FIG. 1, includes a reactor chamber 11 which has a precursor delivery system 12. The precursor delivery system 12 includes a source of carrier gas 13 which could, for example, be a pressurized tank of gas directed to a mass flow controller 14. The gas flowing through the mass flow controller 14 combines with a precursor source 15. The mixed gases are injected into the reactor chamber 11 through a valve 16.

The carrier gas 13 can be a mixture of combustible gases, thus serving as a combustion gas 13a. Alternatively, the combustion gas 13a can be introduced separately into the system after the precursor source 15 and the carrier gas 13 have been combined. In an embodiment not shown, the carrier gas 13 can be premixed with a combustion gas 13a prior to delivery to the mass flow controller 14.

The valve 16 directs the combination of carrier gas 13 and precursor gas 15 into a flat flame combustor 17. The flat flame combustor 17 is shown in more detail in FIG. 1a. The flat flame combustor 17 comprises a water-cooled perforated copper plate 22 contained in a cylindrical steel fixture 18. The flat flame combustor 17 also has a water inlet 19 and a water outlet 20 both in fluid communication with the cylindrical steel fixture 18. Combustor 17 includes a fuel gas inlet 21 used to generate a steady state combustion flame 23.

The flame 23 extends a few millimeters out of the combustor 17 and is uniform over the face of the perforated copper plate 22, providing an intense heat source with a short residence time on the order of a fraction of a second for effective thermal decomposition and reaction of the precursor carrier gas stream. The copper plate thickness/burner diameter ratio may vary between 1/8 and 1/2. The hole diameter is between 0.5–1.5 mm. These parameters are varied to achieve a uniform flat combustion flame for the system. The combustor 17 is capable of operating at pressures as low as 1–50 mbar, which is in the optimum range for the synthesis of nonagglomerated nanoparticles.

The gas flows in the direction shown by arrow 25a through the combustor 17 forming reaction product particles shown as 26 (FIG. 1) which are directed at a refrigerated surface 27.

In the embodiment shown in FIG. 1, the refrigerated surface is a cylinder 27 which is rotated in the direction shown by arrow 28. A scraper 29 opposite the flat flame combustor 17 separates particles formed on the refrigerated surface 27, causing them to fall downwardly where they are gathered by a funnel 30 directing them into a collection compartment 31, all within the reaction chamber 11. Preferably, the refrigerated surface 27, is refrigerated and maintained at a temperature effective to cause the vapor to condense. Generally, this will be at less than about 0° C. As shown in FIG. 1, this is accomplished with liquid nitrogen in the cylinder 27. The internal pressure of the reaction chamber 11 is controlled by a vacuum pump 32 connected to the reaction chamber 11 through a control valve 33 and a turbo pump 34 connected to the reaction chamber 11 through a control valve 35. The vacuum pump 32 allows for high speed pumping of the reaction chamber 11.

The reactor of the present invention enables the carrier gas 13, the precursor source 15 and the combustion gas 13a to be combined in any desired ratio. In this particular embodiment, the carrier gas 13 is simply bubbled through the precursor source 15. This will cause a small portion of precursor vapor to mix with the carrier gas. The valve 16 assures controlled rate of delivery of the precursor gas stream to the combustion flame reactor.

A wide variety of different combustion gases, carrier gases and precursors can be utilized to provide a wide variety of different nanosized particles. The carrier gas can be, for example, any inert gas such as a noble gas, preferably helium or argon. Nitrogen can also be used, as well as more reactive gases such as ammonia or hydrogen. Other suitable gases include methane, ethylene, nitrous oxide, oxygen, carbon monoxide, and carbon dioxide. The molar concentration of precursor will be 0.1 to 30 percent.

The precursor source 15 can be any metalorganic compound which can be evaporated to form a gaseous phase in the carrier gas. These include all organometallic compounds used in current CVD processes. Suitable metalorganic compounds include, for example, aluminum, zirconium, yttrium, nickel, titanium, silicon, molybdenum, and tungsten silazanes, butoxides, acetyl acetonates, isopropoxides, alkoxides and other metalorganics available commercially. Some compounds are also available in gaseous form at ambient temperature.

The combustion gas 13a will be hydrogen or a hydrocarbon or a mixture thereof in combination with an oxygen source. Preferred hydrocarbons include methane, ethane, butane, propane, acetylene, etc. The amount of oxygen supplied is adequate to ensure complete combustion and the burner may be operated with either a reducing or oxidizing flame. The combustion gas 13a can also be used in place of the carrier gas 13.

The amount of combustion gas used must be sufficient to establish a flame having a temperature between 900°–2220° C. to ensure rapid decomposition of the precursor. Further, the flow rates should be adjusted for the particular flat burner to provide a uniform flat flame.

Generally, the flow rate of the gas stream will be controlled to ensure that all of the precursor decomposes in the reaction flame. Generally, this will be 1–30 mg/cm$^2$, depending on the design of the burner. As indicated, the pressure of the reactor chamber should be from 1–50 mbar. However, the closer the collection surface is to the flame, the higher the pressure can be. Thus, if the collection surface is immediately adjacent the flame, the pressure can be at about ambient pressure. However, it is preferred to operate at pressures no greater than about 50 mbar.

When the system is operated in a nanoparticle powder production mode shown in FIG. 1, a slowly rotating liquid nitrogen cooled metal drum 27 located at >5–6 cm from the burner collects the continuous stream of clusters of the nanoparticles 26 exiting from the combustion zone. Because of the reduced pressure in the reactor chamber 11, the collected nanoparticles are loosely agglomerated, in contrast to the cemented aggregates that are produced under ambient pressure conditions.

In an alternative operational mode shown in FIG. 2A, the nanopowder 26 is collected on a rapidly rotating liquid nitrogen cooled drum 27 that passes through the outer edge of the combustion zone. The rapid quenching of the as-synthesized dusters of nanoparticles enables a much higher production rate of loosely agglomerated powder, even when the precursor concentration is relatively high. Furthermore, to some extent this mode of operation relaxes the low pressure requirements for the production of loosely agglomerated nanopowders. Even though pressures may vary, however, the flat-flame combustor with uniform temperature gradient and gas phase residence time is a prerequisite for the production of nanoparticles of uniform particle size and distribution.

When the system is operated in a nanophase coating deposition mode shown in FIG. 2B, a heated substrate 27a is placed in front of the flat-flame combustor 17 to promote in situ sintering of the clusters or nanoparticles as fast as they arrive at the substrate surface. Heating of the substrate 27a is accomplished by providing a stationary radiant heater within the cylinder substrate 27a. The resulting coating 41 may be porous or dense, depending primarily on the substrate temperature relative to the peak temperature in the combustion flame 23. A favorable diffusional interaction between depositing species and a clean substrate surface yields a well-bonded diffusion coating, whereas a passivated (e.g., oxidized) substrate prevents such an interaction and gives rise to an overlay coating. A combination of diffusion and overlay coating is also possible if the rate of arrival of the depositing species is faster than their diffusion rate into the substrate material.

Figure 2C:
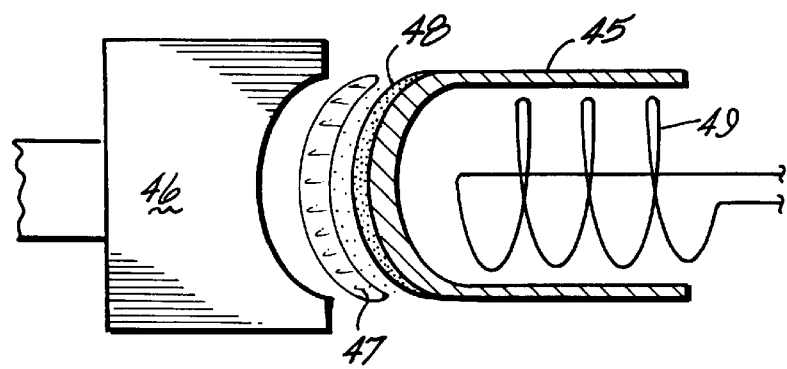
FIG. 2C is a schematic view of the method of the present invention in a shape forming deposition mode.

In an alternative operational mode shown in FIG. 2C, a uniformly heated mandrel 45 which acts as a passive substrate for deposition of a material 48, is used with a burner 46 that provides a flame 47 having a profile that exactly matches the designed profile of the mandrel 45. A heater 49 heats the mandrel 45. Thus, any desired thin/thick structure such as sheet, ring or drum can be fabricated by incremental deposition on a reciprocating or rotating mandrel. After removal from the mandrel, which can be facilitated by the use of a parting compound (e.g., thin graphite or boron nitride layer), additional processing of the free-standing form may be performed.

The CFR method has much in common with conventional Chemical Vapor Deposition (CVD) when operated in the coating deposition and net-shape fabrication modes, except for the much-higher and more uniform deposition rates possible by the flat-flame combustion method. Apparently, this is because of the enhanced sinterability of the superheated active intermediates, clusters and nanoparticles when they arrive together at the moderately heated substrate surface. Again in common with CVD, using two or more combustion flame reactors, nanophase coatings and parts with multicomponent, multiphasic, compositionally modulated or continuously graded structures can be produced.

In addition to a combustion flame, an RF or microwave plasma may also be utilized to provide the reaction energy. Typically, a cylindrical plasma discharge cavity through which the reactants are transported is used. In this case, endothermic or exothermic reactions may be initiated. Hence, this process is ideal for non-oxidizing processes that require the high throughput of a combustion flame synthesis method. The plasma source also allows for the formation of many materials that are not easily produced by direct chemical synthesis.

EXAMPLE 1

In flat-flame combustion synthesis of n-SiO$_2$ powder, the starting compound is hexamethyl-disilazane (HMDS), and the carrier gas is helium. The He gas is bubbled through the liquid HMDS at ambient temperature, giving a gas phase mixture that contains about 2% HMDS in He. Methane, hydrogen and acetylene are used as fuels with oxygen as the oxidizer.

Under typical operating conditions, a dynamic pressure of about 25 mbar is maintained in the reactor chamber by high-speed pumping. Using acetylene as fuel, the equivalence ratio of the premixed acetylene and oxygen is fixed at 1.65 and the total flow rate at 3.1 mg/s per cm$^2$ of burner surface. The carrier gas flow rate is set at about 1 mg/s per cm$^2$ of burner surface. In a typical run, about 5 gm of n-SiO$_2$ powder (95% yield) is collected on the chilled drum in about 90 minutes.

EXAMPLE 2

In flat-flame combustion deposition of n-SiO$_2$ films, the burner-to-substrate distance is set at 2.2 cm, the substrate temperature is maintained at more than 500° C., and the flame parameters are changed to produce a more energetic flame and thus hotter particles impacting the substrate. For acetylene fuel, the equivalence ratio is 1.2 and the total flow rate is 5.8 mg/s per cm$^2$ of burner surface. Other operating parameters are the same as for nanopowder synthesis.

Figure 3:
FIG. 3 is a photograph of a transparent free-formed disc of $SiO_2$ (2×2×0.1 cm).

In a typical run, a thin transparent disc (2 cm×2 cm×0.1 cm) of amorphous SiO$_2$ is formed in about 30 minutes. As shown in FIG. 3, the deposited surface displays a characteristic grape-like morphology, while the fracture surface is smooth and featureless with no indications of microporosity. Thus, it may be concluded that theoretically dense material can be produced by flame deposition of nanoparticles directly onto an appropriately heated substrate.

The practical realization of uniform deposition of high quality synthetic diamond sheet by vapor deposition methods has proved to be a difficult task. A particularly troublesome problem has been the introduction of internal strains during deposition, which appears to be due to non-uniformity in temperature distribution experienced using most deposition methods. Flat-flame combustion synthesis of diamond films can overcome this limitation. Superior uniformity of deposition using several fuel/oxidizer combinations has been demonstrated. Moreover, as compared with "ambient pressure" combustion synthesis, the "low pressure" method offers higher carbon capture efficiency and easier scale-up, making it more applicable to the challenge of uniform coating of large area substrates.

Figure 6:
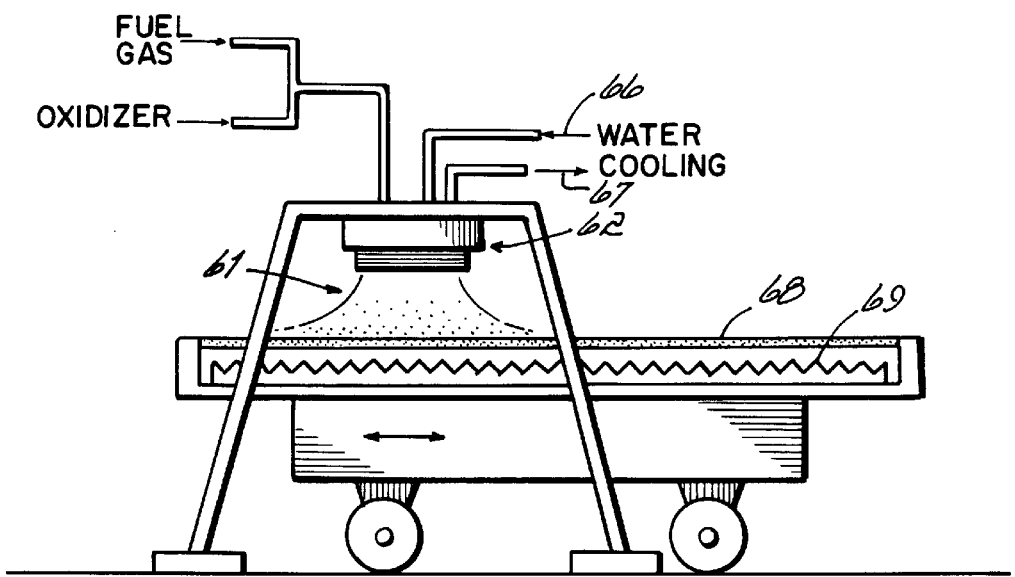
FIG. 6 is a schematic side view of the apparatus used for the diamond sheet deposition method of the present invention.
Figure 4:
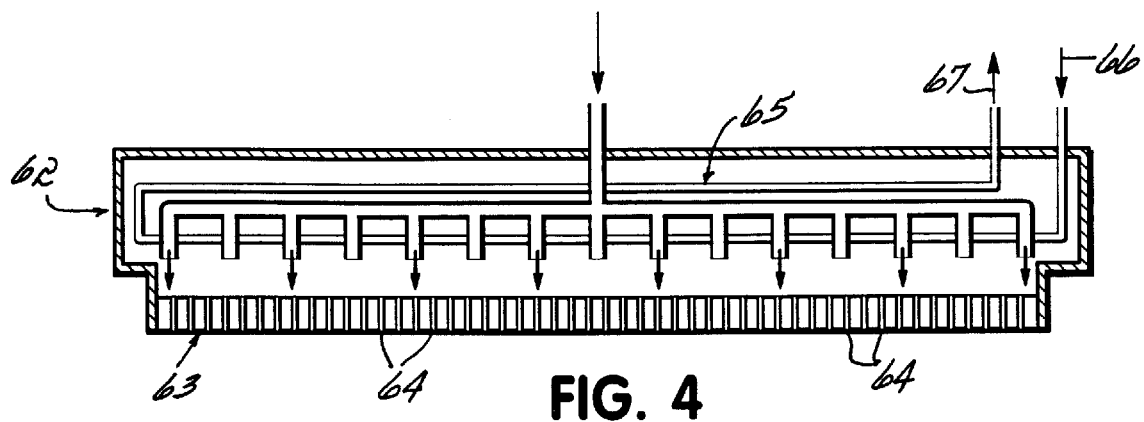
FIG. 4 is a side cross section view of the burner used in the diamond deposition method.
Figure 5:
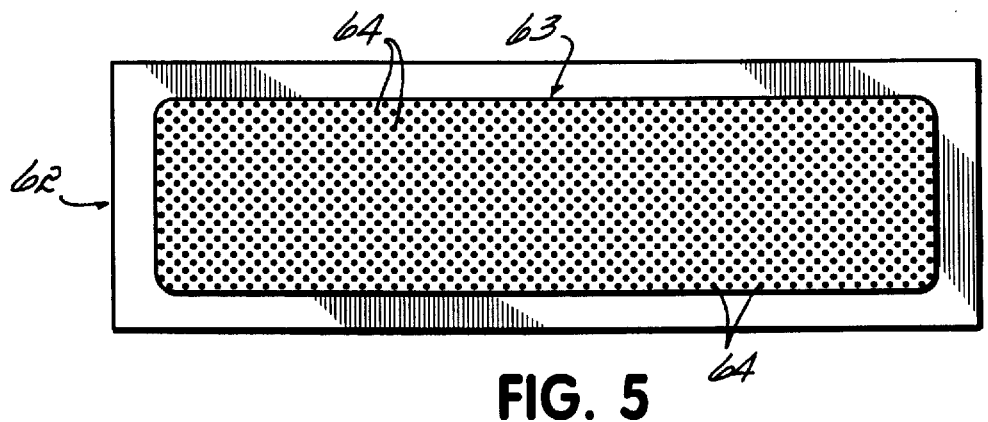
FIG. 5 is a bottom view of the burner of FIG. 4.
Figure 5A:
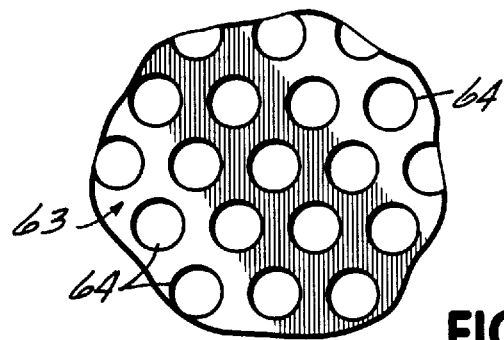
FIG. 5A is an enlarged view of the bottom of the burner of FIG. 4.

A schematic of the new process for large area deposition of "strain-free" diamond sheet is shown in FIGS. 4, 5 and 6. The process employs an "extended" combustion flame 61 as a source of carbon radicals, which are deposited as diamond. The flame 61 is stabilized by a burner 62 that consists of a 2.0 cm thick copper plate 63 with a hexagonal array of 1 mm holes 64 on 2.5 mm centers, shown more particularly in FIGS. 5 and 5A. The burner 62 is cooled by a water cooling conduit 65 that runs through the burner 62. The water runs through the conduit 65 in the direction shown by arrows 66 and 67. The burner 62 runs on either acetylene, ethylene, propylene, or propane and oxygen. The amount of oxygen employed is reduced to ensure diamond formation. The flame gases 61 impinge on the substrate to be coated in a stagnation flow configuration. The thick copper burner 62 ensures a uniform surface temperature across the entire burner face, resulting in a chemically and thermodynamically uniform flow-field over a region roughly equivalent to the burner face.

A substrate material 68 to be coated, typically a carbide or metal that readily forms a carbide, is heated to a temperature of about 700°–900° C. by a resistive heater 69. To enhance the density of diamond nucleation sites, the substrate 68 is pre-treated by scratching with diamond lapping paste. The burner 62 sits between 0.5 and 2 cm above the substrate 68 and is traversed across the length of the substrate 68 in order to coat the entire surface, as shown in FIG. 6. Since the growth rate is approximately 5 microns per hour, the burner 62 must be scanned over the substrate 68 many times to produce a thick deposit of diamond. Both burner 62 and substrate 68 are contained in a vacuum chamber maintained at pressures between 40 and 250 mbar by a roughing pump, which also removes the combustion products.

The coating process is not limited to flat sheet material. On the contrary, as emphasized above, by shaping the burner 62 to match the profile of a rotating mandrel, any desired axisymmetric thick shell structure, such as a ring or drum, may be produced. Furthermore, after removing the thick diamond layer from its mandrel, additional shaping operations may be performed by laser ablation, grinding and polishing. It is envisioned that laser cutting of flat sheet stock diamond would be an economical method for producing machine tools and drill bit inserts.

Both powder and film deposition conditions are being monitored with in situ optical diagnostics. Process models are also being developed which will be incorporated into a closed-loop process monitoring and control system to ensure that optimal deposition conditions are maintained.

Schematics of the process diagnostics are shown in FIG. 6. A solid state optical parametric oscillator laser system 80 with frequency doubling allows the system to repeatedly make a series of scans over frequency ranges of interest to monitor concentrations of key radical species, particle size and distribution, and flame temperature.

Species concentrations of flame species such as OH, NH, CH, CN, NO. H and O are easily measured using laser-induced fluorescence (LIF). The laser frequency is tuned to a resonance, and the collected fluorescence is proportional to the species number density. Temperature measurements may also be made using LIF by determining the relative fluorescence signals from two absorption lines of the same radical (e.g., OH, CH, or NO). To measure particle size and number density, a laser 81 is tuned to a frequency off-resonance from any flame species, and the amount of extinction due to particle absorption is compared to the signal due to particle scattering, yielding a local value for average particle diameter and number density. Simpler diagnostics, such as measuring the OH or $CO_2$ emission ratio (a sensitive indicator of equivalence ratio), are also possible with this setup.

All the associated components (the laser 81, monochromator 82, a frequency doubler 83, a digitizer 84, and an attenuator 85) are under control of a computer 86, and thus the setup may be quickly changed from an absorption/scattering to pure fluorescence to an emission configuration and back without requiring an operator to intercede. A complete set of parameters for a single point in the flame can potentially be obtained in a few minutes.

Such a fully monitored, computer-controlled system is being developed for the reproducible production of nanophase powders, coatings and free-standing forms.

Thus the present invention provides for high rate production of nano-size particles, nanophase coatings and nanocrystalline free standing forms. It is particularly suitable for the synthesis of ceramics and diamond materials. It is also applicable to other material systems. The system is very versatile and lends itself to automated control.

This has been a description of the present invention, along with the preferred method of practicing the invention.

However, the invention itself should be only be defined by the appended claims wherein we claim:

1. A method for the production of nonagglomerated nanoparticle oxide powders comprising combining a vaporized metalorganic precursor compound with an oxygen-containing combustion gas to form a precursor/combustion gas stream;

delivering said precursor/combustion gas stream to a flame combustor and combusting said combustion gas to thereby heat said precursor gas in a reaction chamber wherein said reaction chamber is maintained at a pressure of from about 1 to about 50 mbar, thereby forming non-agglomerated nanoparticle oxide powder.

2. The method of claim 1 further comprising combining said precursor gas with a carrier gas wherein the carrier gas is selected from the group consisting of ammonia, nitrogen, helium, argon, steam, methane, ethylene, nitrous oxide, carbon monoxide, carbon dioxide, oxygen, acetylene, and mixtures of these gases.

3. The method claimed in claim 1 wherein said flame combustor generates a flat combustion flame.

4. The method of claim 3 wherein said precursor is a metalorganic compound selected from the group consisting of aluminum, zirconium, yttrium, nickel, titanium, silicon, molybdenum, and tungsten based compounds.

5. The method of claim 3 wherein said combustion flame is provided by burning in oxygen a gas selected from the group consisting of hydrogen, acetylene, ethylene, propylene, propane, and methane.

6. The method of claim 1 wherein the precursor/carrier gas mixture is provided by bubbling said carrier gas through said metalorganic precursor compound and wherein said precursor/carrier gas mixture is combined with said combustion gas to form said precursor/combustion gas stream.

7. The method of claim 1 wherein said flame combustor comprises a plasma flame.

8. A method for the production of nanostructured coatings comprising combining a vaporized metalorganic precursor compound with a carrier gas to form a precursor/carrier gas stream, delivering said precursor/carrier gas stream to a flat combustor flame, and heating said precursor/carrier gas stream for less than 1 second at a dynamic pressure from about 1 to 50 mbar in a reaction chamber, thereby forming non-agglomerated nanostructured ceramic powder and impinging said nanostructured ceramic powder against a heated surface, thereby sintering the nanoparticles as they arrive on said surface and forming a nanostructured coating.

9. The method of claim 8 wherein the carrier gas is selected from the group consisting of ammonia, nitrogen, helium, argon, methane, ethylene, nitrous oxide, oxygen, carbon monoxide, carbon dioxide, and acetylene.

10. The method of claim 9 wherein said metalorganic precursor compound is selected from the group consisting of aluminum, zirconium, yttrium, nickel, titanium, silicon, molybdenum, and tungsten compounds.

11. The method of claim 9 wherein said precursor/carrier gas mixture is provided by bubbling said carrier gas through said precursor compound in a conventional bubbler unit.

12. The method of claim 8 wherein said combustion flame is provided by burning in oxygen a gas selected from the group consisting of hydrogen, acetylene, ethylene, propylene, propane and methane.

13. The method of claim 8 wherein said heated surface is heated to a temperature of about 300° C. to 1200° C. with a resistive heater.

* * * * *

UNITED STATES PATENT AND TRADEMARK OFFICE
CERTIFICATE OF CORRECTION

PATENT NO. : 5,876,683
DATED : March 2, 1999
INVENTOR(S) : Nicholas Glumac, et al.

It is certified that error appears in the above-identified patent and that said Letters Patent is hereby corrected as shown below:

After the title and before Background of the Invention, please insert:

-- "This invention was made with government support under the Office of Naval Research, Grant No. 14-91-J-1828 and the government has certain rights in the invention." --

Signed and Sealed this

Seventh Day of September, 1999

Attest:

Q. TODD DICKINSON

*Attesting Officer*  *Acting Commissioner of Patents and Trademarks*